United States Patent

[11] 3,581,117

[72] Inventor Lloyd H. Dixon, Jr.
Boxford, Mass.
[21] Appl. No. 743,386
[22] Filed July 9, 1968
[45] Patented May 25, 1971
[73] Assignee Unitrode Corporation
Watertown, Mass.

[54] THYRISTOR CIRCUIT HAVING IMPROVED TURNOFF CHARACTERISTICS
7 Claims, 2 Drawing Figs.

[52] U.S. Cl. ........ 307/252, 307/246, 307/300, 307/305
[51] Int. Cl. ........ H03k 17/00
[50] Field of Search ........ 307/252, 305, 246, 300

[56] References Cited
UNITED STATES PATENTS
3,417,266 12/1968 Webb ........ 307/252
3,132,264 5/1964 Dahme ........ 307/238
OTHER REFERENCES
Howell, G. E. Application Note, 1/65, pp. 23— 24, Fig. 24.

*Primary Examiner*—Donald D. Forrer
*Assistant Examiner*—David M. Carter
*Attorney*—Joseph Weingarten

ABSTRACT: A thyristor circuit in which self-triggering which may be caused by spurious gate drive is prevented. A thyristor is switched off by interrupting the flow of cathode current while providing a gate circuit path for charging the anode-gate junction capacitor. Upon reapplication of cathode current, self-triggering cannot occur by reason of the fully charged condition of the junction capacitor.

INVENTOR
Lloyd H. Dixon, Jr.
BY
ATTORNEYS

THYRISTOR CIRCUIT HAVING IMPROVED TURNOFF CHARACTERISTICS

FIELD OF THE INVENTION

This invention relates to semiconductor circuits and more particularly to thyristor circuits.

BACKGROUND OF THE INVENTION

Thyristors are latching semiconductor switches which are triggered by applying a suitable signal to the gate electrode of the device and are turned off by reducing the anode current to a magnitude less than the device holding current. The anode current is usually reduced by opening the anode or the cathode circuit or by driving the anode negative. Application of anode supply voltage or reapplication of the anode voltage after a device has been turned off can cause self-triggering of the thyristor caused by spurious gate current derived from anode-gate junction capacitance effects. More particularly, a capacitive current, equal to the product of the anode-gate junction capacitance and the rate of rise of the applied anode voltage, is generated upon application of an anode voltage and flows into the gate. This spurious gate current can cause unintentional triggering of the device, with consequent deleterious results in a circuit in which the device is employed. In accordance with the present invention a thyristor circuit is provided in which turnoff and subsequent reapplication of supply voltage is accomplished in a manner which prevents self-triggering.

SUMMARY OF THE INVENTION

Briefly, the invention provides a means for turning off a thyristor in a manner such that the anode-gate junction capacitor can fully charge prior to reenergization of the device. A conductive path is provided in the gate circuit between the anode voltage source and a source of reference potential, and switching means are provided in the cathode circuit for interrupting cathode current. In order to switch off a triggered thyristor, the switching means interrupts the cathode current, causing the device to turn off. After the recovery period, the internal anode-gate junction capacitor charges via the novel path provided in the gate circuit so that, upon reapplication of cathode current, the junction capacitor is fully charged and self-triggering cannot occur. Of course, the invention is also effective to prevent self-triggering upon the initial energization of a thyristor.

DESCRIPTION OF THE DRAWING

The invention will be more fully understood from the following detailed description, taken in conjunction with the accompanying drawings, in which.

DETAILED DESCRIPTION OF THE INVENTION

Figure 1:
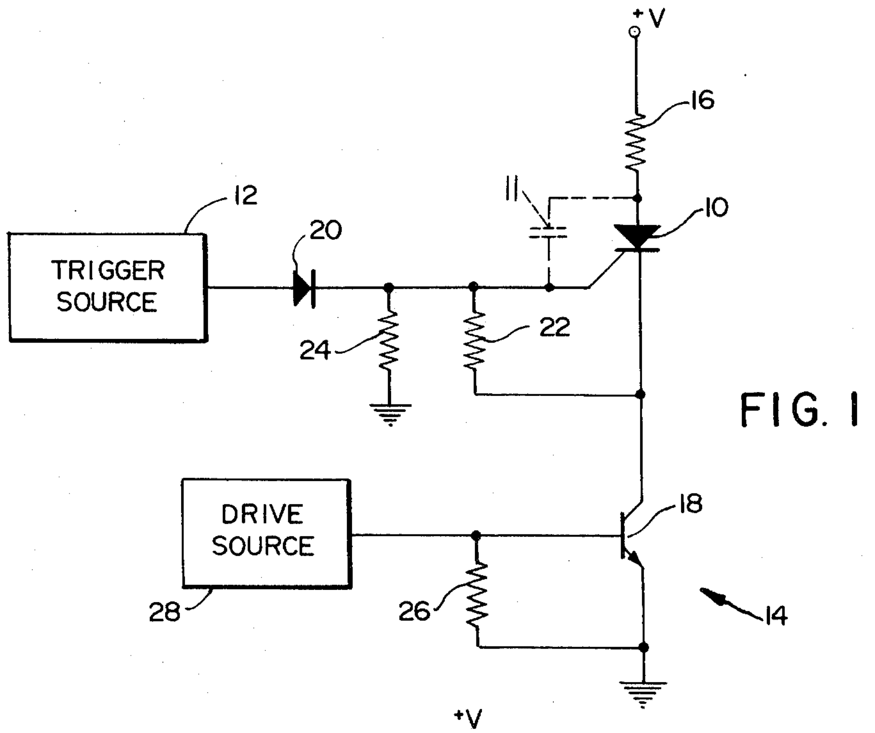
FIG. 1 is a schematic diagram of a thyristor circuit according to the invention.

A thyristor circuit according to the invention is illustrated in FIG. 1 and includes a thyristor 10, trigger source 12 and driver stage 14. The anode of thyristor 10 is connected via a load resistor 16 to a source of anode voltage +V, the cathode is connected to the collector of a transistor 18, and the gate is connected through a diode 20 to trigger source 12. A bias resistor 22 is connected between the gate and cathode of thyristor 10, and a second resistor 24 is connected between the gate and a source of reference potential such as ground. The emitter of transistor 18 is connected to a source of reference potential such as ground, and a bias resistor 26 is connected between the base and emitter of transistor 18. A source of drive signals 28 is coupled to the base of transistor 18, and is operative to switch on the transistor.

In operation, when transistor 18 is switched on by application of a signal from drive source 28, thyristor 10 is enabled and will trigger upon application of a triggering signal to the gate by source 12. In order to switch off the thyristor, base drive is removed from transistor 18, causing it to turn off and thereby interrupting the flow of cathode current in thyristor 10. It is a particular feature of the invention that the anode-gate junction capacitor 11 is serially connected with load resistor 16 and resistor 24 between anode voltage source +V and ground. Following minority carrier recombination occurring during the recovery period, the anode-gate capacitor charges via this path and as a result, no capacitive current flows upon a reenergization of transistor 18, since the junction capacitor is already fully charged. Thus, the gate circuit provides a novel charging path for the junction capacitor when the device is switched off, so that upon reenergization of the device, self-triggering is prevented by the elimination of the mechanism which can cause such spurious triggering.

Resistor 24 is usually of substantially greater resistance value than load resistor 16 and is of a value to provide the desired charging time constant and to limit the reverse gate current to a safe level for the particular thyristor. Typically, load resistor 16 is 1 k. ohms, while resistor 24 is 100 k. ohms. Bias resistor 22, typically 1 k. ohms, is employed to prevent self-triggering due to the junction DC leakage current. The bias resistor 22 is not necessary in all instances, but can be eliminated in those circuits where the magnitude of resistor 24 is of sufficient value to prevent self-triggering due to the junction leakage current.

The recovery time and the junction capacitor charging time are usually rather small compared to the operating speed of the thyristor circuit; thus, the novel circuit performance does not detract from operating speed. Recovery times in the range of 0—50 microseconds are typical, and anode-gate junction capacitance of 2—30 picofarads is typical.

Figure 2:
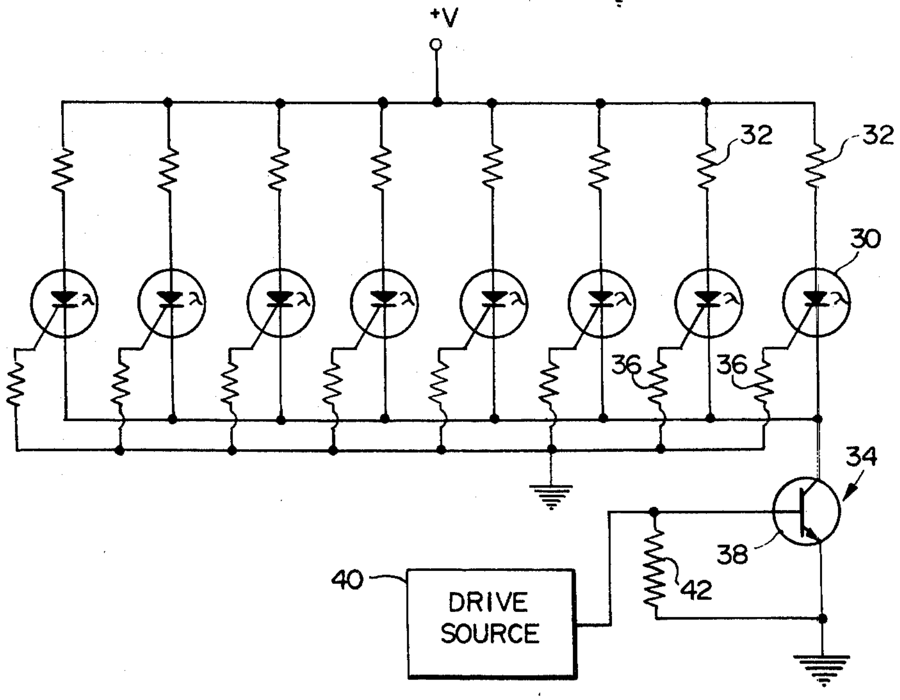
FIG. 2 is a schematic diagram of a thyristor array embodying the invention.

The invention is useful with a wide variety of thyristors, both electrically triggered and light triggered and is also particularly useful to control arrays of such thyristors. A thyristor photocell array embodying the invention is illustrated in FIG. 2. Such an array is useful, for example, in electro-optical systems for sensing light signals from a coded punched record medium, and may be formed by film circuit techniques on a single substrate board. Referring to FIG. 2, the circuit includes eight thyristor photocells 30 each having its anode connected by means of a load resistor 32 to a positive voltage source +V, its cathode connected to a transistor driver stage 34 and its gate electrode connected by means of a gate resistor 36 to a source of reference potential, such as ground.

The thyristor photocells, also known as photrans, provide high level electrical switching without the need for additional amplifying and switching elements. Each photran is triggered by the application of light but does not normally turn off when the light is removed due to the inherent latching characteristics of the device. The transistor driver 34 is operative, according to the invention, to switch off all photrans in the array and to reapply operating voltage to enable the array for light triggering only after the anode-gate capacitor is fully charged. The transistor stage 34 includes transistor 38 having its collector connected to the cathodes of photrans 30, its emitter connected to a source of reference potential such as ground, and its base connected to a source of drive signals 40. A bias resistor 42 is connected between the base and emitter of transistor 38.

When transistor 38 is nonconducting, the photrans cannot be triggered. When, however, transistor 38 is turned on by means of a positive signal from drive source 40 applied to the base electrode, the cathodes of the photrans are grounded and they can thereby be light triggered. Transistor 38 is normally switched off by application of a negative base drive from source 40, causing the conducting photrans to turn off. After recovery of the photrans, the internal anode-gate capacitor will charge through the load resistors 32 and the bias gate resistors 36. Transistor 38 can then be turned on again, grounding the photran cathodes and enabling the photrans to be triggered by light. As explained hereinabove, the photrans will not self-trigger since the internal anode-gate capacitor is already fully charged.

In the illustrated array, resistors 32 are typically 1 k. ohms, while resistors 36 are 27 k. ohms. I will be noted that a bias resistor between the gate and cathode, as in the embodiment of FIG. 1, is not employed since resistors 36 are of sufficient magnitude to suitable prevent self-triggering due to junction leakage current. The magnitude of resistors 36 is also chosen to suitable adjust the light-triggering level of the thyristors.

The invention is not to be limited by what has been particularly shown and described, except as indicated in the appended claims.

What I claim is:

1. A thyristor circuit comprising:

a thyristor having its anode connected through a load resistor to a source of supply voltage and its gate coupled to a source of trigger signals;

switching means connected to the cathode of said thyristor and operative to connect said cathode to a source of reference potential to enable triggering of said thyristor, and to disconnect said cathode from said source of reference potential thereby to switch off said thyristor; and means operative to fully charge the anode-gate capacitor of said thyristor when said cathode is not connected to said source of reference potential, thereby preventing self-triggering of said thyristor.

2. A thyristor circuit according to claim 1 wherein:

said means includes a resistor connected between said gate and said source of reference potential and having a resistance value such to provide an anode-gate capacitance time constant of predetermined magnitude.

3. A thyristor circuit according to claim 1 wherein:

said means includes a resistive path between said source of supply voltage and said source of reference potential, said path being operative to conduct substantially higher gate current when said switching means disconnects said cathode from said source of reference potential.

4. A thyristor circuit according to claim 1 wherein said switching means includes a solid state switch and a source of drive signals for said solid state switch.

5. A thyristor circuit according to claim 4 wherein said solid state switch includes a transistor having its collector connected to the cathode of said thyristor, its emitter connected to said source of reference potential and its base connected to said source of drive signals.

6. A thyristor circuit according to claim 3 further including a resistor connected between said gate and said cathode and of a resistance value operative to prevent self-triggering due to junction leakage current.

7. A thyristor photocell circuit comprising:

a thyristor photocell having its anode connected through a load resistor to a source of supply voltage and its gate connected through a gate resistor to a source of reference potential; and switching means connected to the cathode of said thyristor photocell and operative to connect said cathode to said source of reference potential to enable triggering of said thyristor photocell, and to disconnect said cathode from said source of reference potential to switch off said thyristor photocell;

said gate resistor having a resistance value substantially greater than that of said load resistor, whereby a predetermined charging current will flow in the anode-gate circuit of said thyristor photocell to charge the anode-gate capacitor when said thyristor is switched off.